(12) United States Patent
Gruev (10) Patent No.: US 12,130,180 B2
(45) Date of Patent: Oct. 29, 2024

(54) SINGLE CHIP SPECTRAL POLARIZATION IMAGING SENSOR

(71) Applicant: The Board of Trustees of the University of Illinois, Urbana (IL)

(72) Inventor: Viktor Gruev, Champaign, IL (US)

(73) Assignee: The Board of Trustees of the University of Illinois, Urbana, IL (US)

(*) Notice: Subject to any disclaimer, the term of this patent is extended or adjusted under 35 U.S.C. 154(b) by 95 days.

(21) Appl. No.: 17/887,716

(22) Filed: Aug. 15, 2022

(65) Prior Publication Data

US 2023/0049577 A1 Feb. 16, 2023

Related U.S. Application Data (60) Provisional application No. 63/232,758, filed on Aug. 13, 2021.

(51) Int. Cl.
| | |
|---|---|
| *G01J 3/28* | (2006.01) |
| *G01J 4/04* | (2006.01) |
| *H01L 27/146* | (2006.01) |
| *H01L 31/0232* | (2014.01) |
| *H01L 31/101* | (2006.01) |

(52) U.S. Cl.
CPC ............ *G01J 3/2803* (2013.01); *G01J 3/2823* (2013.01); *G01J 4/04* (2013.01); *H01L 27/14647* (2013.01); *H01L 31/02327* (2013.01); *H01L 31/1013* (2013.01); *G01J 2003/2806* (2013.01); *G01J 2003/2826* (2013.01)

(58) Field of Classification Search
CPC ...... G01J 1/0488; G01J 1/4228; G01J 3/0224; H04N 23/00; H04N 23/10; H04N 23/11; H04N 23/12
See application file for complete search history.

(56) References Cited

U.S. PATENT DOCUMENTS

| | | | |
|---|---|---|---|
| 6,798,586 B1* | 9/2004 | Lyon | G02B 27/0025 359/795 |
| 2007/0159541 A1* | 7/2007 | Sparks | H04N 23/11 348/E9.01 |

OTHER PUBLICATIONS

Bio-inspired imager improves sensitivity in near-infrared fluorescence image-guided surgery. Optica 5, 413-422, doi: 10.1364/OPTICA.5.000413 (2018) (Year: 2017)*
Powell, S. B. et al., Bioinspired polarization vision enables underwater geolocation. *Science advances* 4, eaao6841 (2018).
Garcia, M. et al., Bioinspired polarization imager with high dynamic range. *Optica* 5, 1240-1246 (2018).

(Continued)

*Primary Examiner* — Christopher K Peterson
(74) *Attorney, Agent, or Firm* — Sunstein LLP (57) ABSTRACT

An image sensor capable of recording both spectral and polarization properties of light using a single chip device includes an at least 2048 by 2048 array of superpixels. Each superpixel includes an array of spectral pixels, and an adjacent array of polarization pixels. Each spectral pixel includes a spectral filter and a stack of photodiodes, where each photodiode has a different quantum efficiency and is, therefore, sensitive to a different wavelength of light passed by the spectral filter. Each polarization pixel includes a polarization filter and a stack of photodiodes, similar to the spectral pixel photodiode stacks.

20 Claims, 4 Drawing Sheets
(3 of 4 Drawing Sheet(s) Filed in Color)

(56) References Cited

OTHER PUBLICATIONS

Garcia, M. et al., Bio-inspired color-polarization imager for real-time in situ imaging. *Optica* 4, 1263-1271, doi:10.1364/OPTICA.4.001263 (2017).
York, T. et al., 260 frames-per-second 648×488 resolution division-of-focal-plane polarimeter with structural dynamics and tracking applications. *Optics Express* 24, 8243-8252, doi:10.1364/OE.24.008243 (2016).
Marinov, R. et al., A 4-megapixel cooled CCD division of focal plane polarimeter for celestial imaging. *IEEE Sensors Journal* 17, 2725-2733 (2017).
York, T., Bioinspired polarization imaging sensors: from circuits and optics to signal processing algorithms and biomedical applications. *Proceedings of the IEEE* 102, 1450-1469 (2014).
Gruev, V. et al., CCD polaiization imaging sensor with aluminum nanowire optical filters. *Optics express* 18, 19087-19094 (2010).
Garcia, N. M. et al., Surface normal reconstruction using circularly polarized light. *Optics express* 23, 14391-14406 (2015).
Gilboa, E. et al., Image interpolation and denoising for division of focal plane sensors using Gaussian processes. *Optics express* 22, 15277-15291 (2014).
Powell, S. B. et al., Calibration methods for division-of-focal-plane polarimeters. *Optics express* 21, 21039-21055 (2013).
Gao, S. & Gruev, V., Bilinear and bicubic interpolation methods for division of focal plane polarimeters. *Optics express* 19, 26161-26173 (2011).
Gao, S. & Gruev, V., Gradient-based interpolation method for division-of-focal-plane polarimeters. *Optics express* 21, 1137-1151 (2013).
Ahmed, A. et al., Four-Directional Adaptive Residual Interpolation Technique for DoFP Polarimeters With Different Micro-Polarizer Patterns. *IEEE Sensors Journal* 18, 7990-7997 (2018).
Ahmed, A. et al., Residual interpolation for division of focal plane polarization image sensors. *Optics Express* 25, 10651-10662, doi:10.1364/OE.25.010651 (2017).
Shwartz, S. et al., 2006 IEEE Computer Society Conference on Computer Vision and Pattern Recognition (CVPR'06). 1984-1991 (IEEE).
Schechner, Y. Y. & Karpel, N., Recovery of underwater Visibility and structure by polarization analysis. *IEEE Journal of oceanic engineering* 30, 570-587 (2005). 17 Goldstein, D. H. *Polarized light*. (CRC press, 2017).
Trippe, S., Polarization and Polarimetry: A Review. *Journal of The Korean Astronomical Society* 47, 15-39 (2014).
Treibitz, T. & Schechner, Y. Y., Active polarization descattering. *IEEE transactions on pattern analysis and machine intelligence* 31, 385-399 (2008).
Brady, P. & Cummings, M., Differential response to circularly polarized light by the jewel scarab beetle Chrysina gloriosa. *The American Naturalist* 175, 614-620 (2010).
Cronin, T. W. et al., Multichannel spectrometers in animals. *Bioinspiration & biomimetics* 13, 021001 (2018).
Shashar, N. et al., Cuttlefish use polarization sensitivity in predation on silvery fish. *Vision research* 40, 71-75 (2000).
Chiou, T.-H. et al., Circular polarization vision in a stomatopod crustacean. *Current Biology* 18, 429-434 (2008).
Roberts, N. W. et al., Animal Polarization Imaging and Implications for Optical Processing. *Proceedings of the IEEE* 102, 1427-1434 (2014).
Calabrese, G. M. et al., Polarization signaling in swordtails alters female mate preference. *Proceedings of the National Academy of Sciences* 111, 13397-13402, doi:10.1073/pnas.1321368111 (2014).
Sweeney, A. et al., Polarized light as a butterfly mating signal. *Nature* 423, 31-32 (2003).
Salomatina-Motts, E. et al., Multimodal polarization system for imaging skin cancer. *Optics and Spectroscopy* 107, 884-890 (2009).

Antonelli, M.-R. et al., Mueller matrix imaging of human colon tissue for cancer diagnostics: how Monte Carlo modeling can help in the interpretation of experimental data. *Optics express* 18, 10200-10208 (2010).
Baldwin, A. et al., *Proceedings of the 25th Annual International Conference of the IEEE Engineering in Medicine and Biology Society (IEEE Cat. No. 03CH37439)*. 1027-1030 (IEEE).
Charanya, T. et al., Trimodal color-fluorescence-polarization endoscopy aided by a tumor selective molecular probe accurately detects flat lesions in colitis-associated cancer. *BIOMEDO* 19, 126002-126002 (2014).
Chiang, J. Y. & Chen, Y.-C., Underwater image enhancement by wavelength compensation and dehazing. *IEEE Transactions on Image Processing* 21, 1756-1769 (2011).
Drews, Jr., P. et al., *2013 IEEE International Conference on Computer Vision Workshops*. 825-830 (IEEE).
Li, C.-Y. et al., Underwater image enhancement by dehazing with minimum information loss and histogram distribution prior. *IEEE Transactions on Image Processing* 25, 5664-5677 (2016).
Tyo, J. S., Design of optimal polarimeters: maximization of signal-to-noise ratio and minimization of systematic error. *Applied optics* 41, 619-630 (2002).
Tyo, J. S. et al., Review of passive imaging polarimetry for remote sensing applications. *Appl. Opt.* 45, 5453-5469, doi:10.1364/AO.45.005453 (2006).
Cong Phuoc, H. et al., "Shape and Refractive Index Recovery from Single-View Polarisation Images", *Computer Vision and Pattern Recognition (CVPR), 2010 IEEE Conference on*. 1229-1236.
Reckfort, J. et al., "Extracting the inclination angle of nerve fibers within the human brain with 3D-PLI independent of system properties," Proc. SPIE 8873, Polarization Science and Remote Sensing VI, 88730F (Sep. 27, 2013); doi: 10.1117/12.2023198 (11 pages).
Chenault, D. et al., "Polarimetric sensor systems for airborne ISR," Proc. SPIE 9076, Airborne Intelligence, Surveillance, Reconnaissance (ISR) Systems and Applications XI, 90760K (Jun. 9, 2014); doi: 10.1117/12.2053918 (10 pages).
Stürzl, W. & Carey, N., in *Computer Vision—ECCV 2012. Workshops and Demonstrations* vol. 7584 *Lecture Notes in Computer Science* (eds Andrea Fusiello, Vittorio Murino, & Rita Cucchiara) Ch. 43, 431-440 (Springer Berlin Heidelberg, 2012).
Pezzaniti, J. L. et al., "Detection of Obscured Targets with IR Polarimetric Imaging", *Proc. of SPIE*. 90721D-90721D-90712 (12 pages).
Voss, K. J. & Souaidia, N., POLRADS: polarization radiance distribution measurement system. *Optics Express* 18, 19672-19680, doi:10.1364/OE.18.019672 (2010).
Marshall, N. J. et al., The Compound Eyes of Mantis Shrimps (Crustacea, Hoplocarida, Stomatopoda). I. Compound Eye Structure: The Detection of Polarized Light. *Philosophical Transactions of the Royal Society of London. Series B: Biological Sciences* 334, 33-56, doi:10.1098/rstb.1991.0096 (1991).
Gruev, V. & York, T., *High Resolution CCD Polarization Imaging Sensor*. (Int. Image Sensor Workshop, 2011).
Wang, J. J. et al., High-Performance, large area, deep ultraviolet to infrared polarizers based on 40 nm line/78 nm space nanowire grids. *Applied Physics Letters* 90, -, doi:doi:http://dx.doi.org/10.1063/1.2437731 (2007).
Zhao, Y. et al., Twisted optical metamaterials for planarized ultrathin broadband circular polarizers. *Nat Commun* 3, 870 (2012).
Peltzer, J. J. et al., Ultra-high extinction ratio micropolarizers using plasmonic lenses. *Optics Express* 19, 18072-18079, doi:10.1364/OE.19.018072 (2011).
Gao, L. & Smith, R. T., Optical hyperspectral imaging in microscopy and spectroscopy—a review of data acquisition. *Journal of biophotonics* 8, 441-456 (2015).
Lu, G. & Fei, B., Medical hyperspectral imaging: a review. *BIOMEDO* 19, 010901 (2014).
Shaw, G. A. & Burke, H. K., Spectral imaging for remote sensing. *Lincoln laboratory journal* 14, 3-28 (2003).
Gao, L. & Wang, L. V., A review of snapshot multidimensional optical imaging: measuring photon tags in parallel. *Physics reports* 616, 1-37 (2016).

(56) References Cited

OTHER PUBLICATIONS

Garcia, M. et al., Bio-inspired imager improves sensitivity in near-infrared fluorescence image-guided surgery. *Optica* 5, 413-422, doi:10.1364/OPTICA.5.000413 (2018).
Fossum, E. R., CMOS image sensors: Electronic camera-on-a-chip. *IEEE transactions on electron devices* 44, 1689-1698 (1997).
Song, Y. M. et al., Digital cameras with designs inspired by the arthropod eye. *Nature* 497, 95-99, doi:https://doi.org/10.1038/nature12083 (2013).
Thoen, H. H. et al., A Different Form of Color Vision in Mantis Shrimp. *Science* 343, 411-413, doi:10.1126/science.1245824 (2014).
Gruev, V., Fabrication of a dual-layer aluminum nanowires polarization filter array. *Optics Express* 19, 24361-24369, doi:10.1364/OE.19.024361 (2011).
Gruev, V. et al., Fabrication of a dual-tier thin film micropolarization array. *Optics express* 15, 4994-5007 (2007).
York, T. et al., Real-time high-resolution measurement of collagen alignment in dynamically loaded soft tissue. *BIOMEDO* 19, 066011-066011 (2014).
Tian, H. et al., Analysis of temporal noise in CMOS photodiode active pixel sensor. *IEEE Journal of Solid-State Circuits* 36, 92-101 (2001).
Seo, M.-W et al., in *Solid-State Circuits Conference (ISSCC), 2017 IEEE International.* 80-81 (IEEE).
Ma, J. & Fossum, E. R., Quanta image sensor jot with sub 0.3 e-rms read noise and photon counting capability. *IEEE Electron Device Letters* 36, 926-928 (2015).
Fante, R. L., Electromagnetic beam propagation in turbulent media: an update. *Proceedings of the IEEE* 68, 1424-1443 (1980).
Christie, S. & Kvasnik, F., Contrast enhancement of underwater images with coherent optical image processors. *Applied optics* 35, 817-825 (1996).
Chang, P. C. et al., Improving visibility depth in passive underwater imaging by use of polarization. *Applied optics* 42, 2794-2803 (2003).
Léonard, I. et al., Sensitive test for sea mine identification based on polarization-aided image processing. *Optics express* 21, 29283-29297 (2013).
You, Y. et al., Measurements and simulations of polarization states of underwater light in clear oceanic waters. *Applied optics* 50, 4873-4893 (2011).
Waterman, T. H., Polarization Patterns in Submarine Illumination. *Science (New York, N.Y.)* 120, 927, doi:10.1126/science.120.3127.927 (1954).
Jerlov, N. G., Oceanic Light Scattering Properties Related to Dynamic Conditions. *Optical Engineering* 8, 080389-080389-, doi:10.1117/12.7971519 (1970).
Waterman, T. H. & Westell, W. E., Quantitative Effect of the Sun's Position on Submarine Light Polarization. *Journal of Marine Research* 15, 149-169 (1956).
Reda, I. & Andreas, A., Solar position algorithm for solar radiation applications. *Solar Energy* 76, 577-589, doi:10.1016/j.solener.2003.12.003 (2004).
Jerlov, N. G., *Optical Oceanography*. 65-68 (1968).
Land, E.H. et al., Lightness and retinex theory. *Josa* 61, 1-11 (1971).
McCann, J. J. et al., Quantitative studies in retinex theory a comparison between theoretical predictions and observer responses to the "color mondrian" experiments. *Vision research* 16, 445-IN443 (1976).
Horn, B. K., Determining lightness from an image. *Computer graphics and image processing* 3, 277-299 (1974).
Blake, A., Boundary conditions for lightness computation in Mondrian world. *Computer vision, graphics, and image processing* 32, 314-327 (1985).
Brainard, D. H. & Wandell, B. A., Analysis of the retinex theory of color vision. *JOSA A* 3, 1651-1661 (1986).
Grosse, R. et al., "Ground truth dataset and baseline evaluations for intrinsic image algorithms", *2009 IEEE 12th International Conference on Computer Vision.* 2335-2342 (8 pages).
Bell, S., Bala, K. & Snavely, N., Intrinsic images in the wild. *ACM Transactions on Graphics (TOG)* 33, 1-12 (2014).
Barron, J. T. & Malik, J., Shape, illumination, and reflectance from shading. *IEEE transactions on pattern analysis and machine intelligence* 37, 1670-1687 (2014).
Narihira, T., Maire, M. & Yu, S. X., "Learning Lightness from Human Judgement on Relative Reflectance", *Proceedings of the IEEE Conference on Computer Vision and Pattern Recognition.* 2965-2973 (9 pages).
Janner, M. et al., "Self-Supervised Intrinsic Image Decomposition", 31st Conference on Neural Information Processing Systems (NIPS 2017), Long Beach, CA (11 pages).
Ma, W.-C. et al., "Single Image Intrinsic Decomposition without a Single Intrinsic Image", *Proceedings of the European Conference on Computer Vision (ECCV).* 201-217.
Lettry, L. et al., "Unsupervised Deep Single-Image Intrinsic Decomposition using Illumination-Varying Image Sequences", Computer Graphics Forum, The Eurographics Association and John Wiley & Sons Ltd. (2018) 11 pages.
Li, Z. & Snavely, N., "CGIntrinsics: Better Intrinsic Image Decomposition through Physically-Based Rendering", *Proceedings of the European Conference on Computer Vision (ECCV)* 17 pages.
Cook, R. D. & Weisberg, S., Characterizations of an empirical influence function for detecting influential cases in regression. *Technometrics* 22, 495-508 (1980).
Deuzé, J. et al., Remote sensing of aerosols over land surfaces from POLDER-ADEOS-1 polarized measurements. *Journal of Geophysical Research: Atmospheres* 106, 4913-4926 (2001).
Puttonen, E. et al., Measurement of reflectance properties of asphalt surfaces and their usability as reference targets for aerial photos. *IEEE Transactions on Geoscience and Remote Sensing* 47, 2330-2339 (2009).

\* cited by examiner

SINGLE CHIP SPECTRAL POLARIZATION IMAGING SENSOR

The present application claims priority to U.S. Provisional Patent Application Ser. No. 63/232,758, entitled "Single chip spectral polarization imaging sensor" and filed Aug. 13, 2021. The foregoing application is incorporated herein by reference in its entirety.

This invention was made with Government support under Grant No. N00014-21-1-2177 awarded by the United States Navy/Office of Naval Research. The United States Government has certain rights in the invention.

TECHNICAL FIELD

The invention relates to pixelated digital image sensors, and more particularly to pixelated digital image sensors that capture both spectral and polarization properties of light.

BACKGROUND ART

Capturing both spectral and polarization properties of light are beneficial in many applications ranging from medical to remote sensing. Light is a transverse wave that is fully characterized by its intensity, wavelength, and polarization. Polarization of light, which defines the orientation of light waves as they propagate through space and time, is undetectable with the unaided eye or with typical color or monochromatic image sensors. Nevertheless, polarization imaging is of great interest to various research communities, including remote sensing, marine biology, and medical imaging, in part because the polarization state of light changes when it interacts with an object, whether through reflection, transmission, or scattering. The properties of light can be described in terms of four quantities termed the Stokes parameters:

$$I(\theta,\phi)=\tfrac{1}{2}[S_0+S_1\cos 2\theta+S_2\sin 2\theta \cos\phi+S_3\sin 2\theta \sin\phi]$$

This equation describes the intensity of a light beam observed through a linear polarizer rotated by an angle $\Theta$ with respect to a reference axis and a retarder with a phase shift $\Phi$. The first Stokes parameter, $S_0$, describes the total intensity of the light; $S_1$ and $S_2$ describe the linear polarization properties, and $S_3$ describes the circular polarization properties.

In many applications, including underwater geolocalization and underwater dehazing, only the linear polarization properties of light are relevant. Hence, only the first three Stokes parameters are important for these applications. To determine these three parameters, at least three distinct measurements with linear polarization filters are required. Furthermore, it has been theoretically demonstrated that if N polarization measurements are acquired, then the orientation between the linear polarization filters should be offset by (180/N) degrees to maximize the signal-to-noise ratio (SNR) of the polarization images. Therefore, if three distinct polarization measurements are acquired, the linear polarization filters should be offset by 60° for optimal SNR imaging of polarization information. Based on these measurements, the first three Stokes parameters can be determined as follows:

$$S_0 = \frac{2I_0 + I_{60} + I_{120}}{2} \quad S_1 = \frac{2I_0 - I_{60} - I_{120}}{2} \quad S_2 = \frac{I_{60} - I_{120}}{\sqrt{3}}$$

In these equations, $I_0$ is the intensity of the e-vector filtered with a 0° linear polarization filter and no phase retardation; $I_{60}$ is the intensity of the e-vector filtered with a 60° linear polarization filter and no phase retardation; and $I_{120}$ is the intensity of the e-vector filtered with a 120° linear polarization filter and no phase retardation.

In summary, the first three Stokes parameters completely characterize linearly polarized and unpolarized states of light. To compute these parameters, the incoming light wave must be filtered with at least three linear polarization filters offset by 60°. Hence, to fully characterize the linear polarization properties of light, an image sensor has to utilize at least three linear polarization filters offset by 60° together with an array of imaging elements The most predominant method for polarization imaging is accomplished by rotating a linear polarization filter and retarder in front of an imaging sensor and capturing a static image at each rotation. This type of sensor is called a division-of-time polarimeter, since it requires capturing the same scene at multiple steps in time. This simple design suffers from a low frame rate, as each complete set of measurements requires multiple frames. It also requires a static scene for the duration of the measurement, since any change in the scene between rotations would induce a motion blur.

An alternate method with static optics projects the same scene to multiple sensors. Each sensor uses a different polarizer and/or retarder in front of the optical sensor to solve for different Stokes parameters. This mode is called division of amplitude, since the same optical scene is simultaneously projected full frame multiple times at reduced amplitude per projection. Drawbacks to this system include the bulk and expense of having a large array of optics and multiple sensors, and reduced amplitude per sensor. Maintaining a fixed alignment of the optics so all sensors see the same co-registered image also poses a challenge to this polarization architecture, which typically requires image registration in software.

A similar optically static method uses optics to project the same scene to different subsections of a single sensor. Each subsection contains a different analyzer to solve for the Stokes parameters. This type of sensor is called a division-of-aperture polarimeter, since the aperture of the sensor is subdivided for polarization measurement of the same scene. The advantage is that it requires only one sensor, but the disadvantage is that it is prone to misalignment and can contain a long optics train. Multiple scene sampling on the same array also reduces the effective resolution of the sensor, without the possibility of up-sampling through interpolation. The system complexity, from maintaining the optical alignment to the image processing, have precluded them from wider use.

SUMMARY OF THE EMBODIMENTS

An embodiment of the present invention provides a superpixel for a digital camera. The superpixel includes an array of spectral pixels, and an adjacent array of polarization pixels. Each spectral pixel includes a first stack of at least two photodiodes. Each photodiode of the at least two photodiodes is configured to have a quantum efficiency at a wavelength different from the quantum efficiency at the wavelength of each other photodiode of the at least two photodiodes. Each spectral pixel also includes a spectral filter configured to pass at least two transmission peaks to its respective first stack of at least two photodiodes.

Each polarization pixel includes a second stack of at least two photodiodes. Each photodiode of the at least two photodiodes is configured to have a quantum efficiency at a wavelength different from the quantum efficiency at the wavelength of each other photodiode of the at least two photodiodes. Each polarization pixel also includes a polarization filter configured to pass a polarization of light to its respective second stack of at least two photodiodes different from the polarization passed by each other polarization filter in the superpixel.

Optionally, in any embodiment, each spectral pixel includes a first stack of at least three photodiodes, and each polarization pixel includes a second stack of at least three photodiodes.

Further optionally, in any embodiment, the superpixel includes three spectral pixels. Alternatively or in addition, in any embodiment, the spectral filter of a first one of the three spectral pixels is an optical comb filter configured to pass transmission peaks in the ranges of 400-425 nm, 475-500 nm, and 550-575 nm; the spectral filter of a second one of the three spectral pixels is an optical comb filter configured to pass transmission peaks in the ranges of 425-450 nm, 500-525 nm, and 575-600 nm; and the spectral filter of a third one of the three spectral pixels is an optical comb filter configured to pass transmission peaks in the ranges of 450-475 nm, 525-550 nm, and 600-625 nm.

Also optionally, in any embodiment, the superpixel includes three polarization pixels. Alternatively or in addition, in any embodiment, the polarization filter of a first one of the three polarization pixels is configured to pass a 0 degree polarization of light; the polarization filter of a second one of the three polarization pixels is configured to pass a 60 degree polarization of light; and the polarization filter of a third one of the three polarization pixels is configured to pass a 120 degree polarization of light.

Optionally, in any embodiment, each spectral pixel includes a first stack of three photodiodes. Also optionally, in any embodiment, each polarization pixel includes a second stack of three photodiodes.

Optionally, in any embodiment, each photodiode in a first stack of photodiodes has a different quantum efficiency. Also optionally, in any embodiment, each photodiode in a second stack of photodiodes has a different quantum efficiency.

Further optionally, in any embodiment, each photodiode is a CMOS photodetector.

Another embodiment of the present invention provides a pixelated image sensor. The pixelated image sensor includes an at least 2048 by 2048 array of superpixels.

Each superpixel includes an array of spectral pixels, and an adjacent array of polarization pixels. Each spectral pixel includes a first stack of at least two photodiodes. Each photodiode of the at least two photodiodes is configured to have a quantum efficiency at a wavelength different from the quantum efficiency at the wavelength of each other photodiode of the at least two photodiodes. Each spectral pixel also includes a spectral filter configured to pass at least two transmission peaks to its respective first stack of at least two photodiodes.

Each polarization pixel includes a second stack of at least two photodiodes. Each photodiode of the at least two photodiodes is configured to have a quantum efficiency at a wavelength different from the quantum efficiency at the wavelength of each other photodiode of the at least two photodiodes. Each polarization pixel also includes a polarization filter configured to pass a polarization of light to its respective second stack of at least two photodiodes different from the polarization passed by each other polarization filter in the superpixel.

Alternatively or in addition, the array of superpixels has a superpixel pitch no greater than 10 μm.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing features of embodiments will be more readily understood by reference to the following detailed description, taken with reference to the accompanying drawings, in which.

DETAILED DESCRIPTION OF SPECIFIC EMBODIMENTS

Unless defined otherwise, all technical and scientific terms used herein have the same meaning as commonly understood by one of skill in the art to which the invention pertains. Although any methods and materials similar to or equivalent to those described herein can be used in the practice or testing of the present invention, the preferred methods and materials are described herein.

The imaging sensor described herein is capable of recording both spectral and polarization properties of light using a single chip device. Capturing both spectral and polarization properties of light are beneficial in many applications ranging from medical imaging to underwater imaging to remote sensing. This technology can enable detection of cancerous vs. healthy cells, detection of underwater objects, such as mines, and other. The sensor is realized by monolithically integrating pixelated spectral and polarization filters with an image sensor that includes vertically stacked photodetectors. This combination of the filters and image sensor enables detection of spectral and polarization properties of a target with high spatial resolution and in real-time. The sensor described herein can be used in the medical field for detecting cancerous vs healthy cells, imaging neural activity from cells or studying other medical pathologies or basic science problems. The sensor has many defense applications, such as improving visibility of targets in hazy conditions, such as fog or under water, and identifying targets. The sensor can also be used for navigational purposes in GPS-denied areas.

Figure 1:
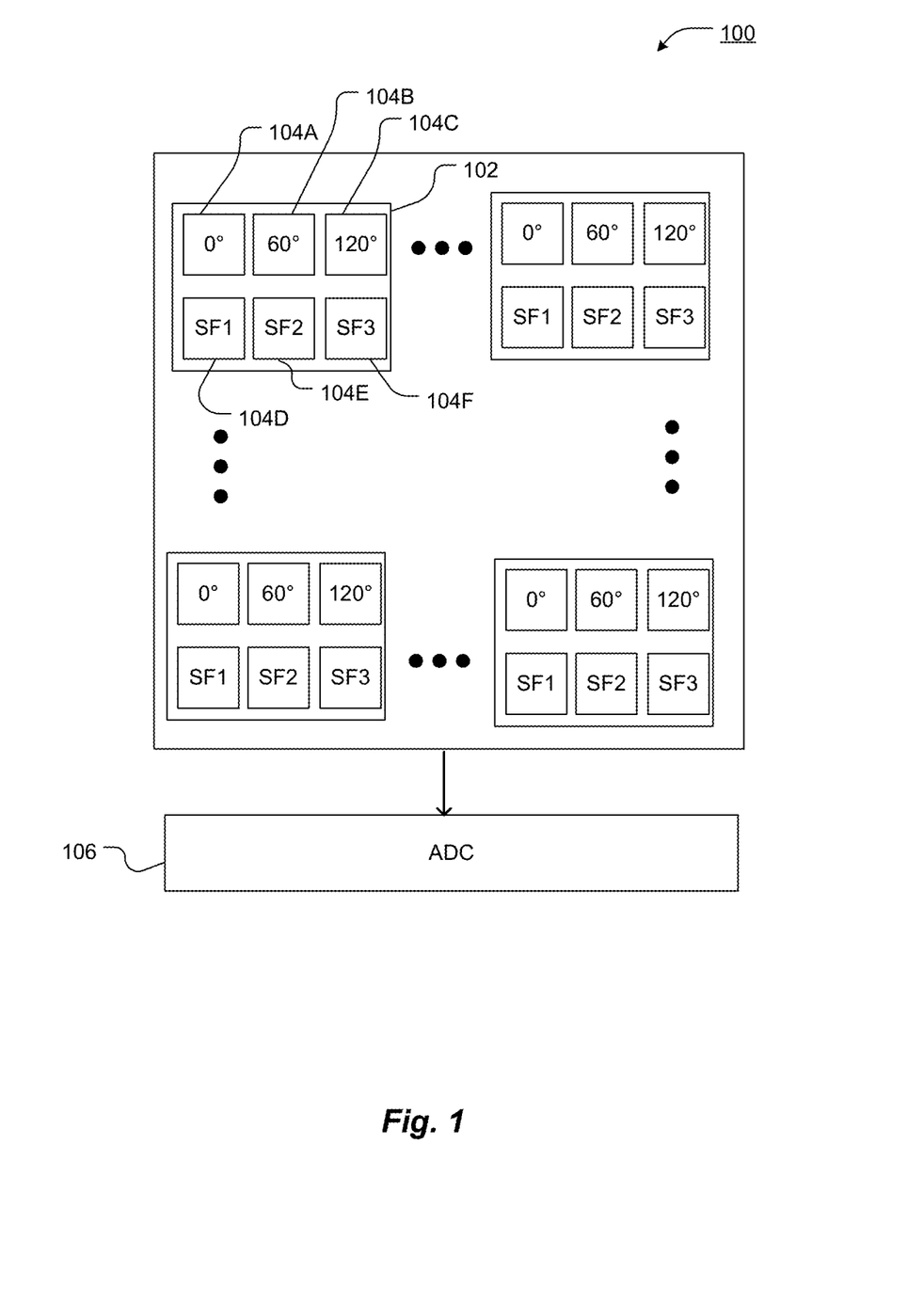
FIG. 1 shows a block diagram of a spectral polarization imaging sensor in accordance with an embodiment of the present invention.

FIG. 1 shows a block diagram of a spectral polarization imaging sensor in accordance with an embodiment of the present invention. Spectral polarization imaging sensor 100 includes an array of superpixels 102. Illustratively, the imaging sensor 100 may have an array of 2048 by 2048 superpixels 102, which corresponds to a spatial resolution of 4 megapixels. The superpixels 102 are arranged adjacent to one another. While an array of 2048 by 2048 superpixels is described herein, it is expressly contemplated that any other number or pattern of superpixels form the imaging sensor 100. The array of superpixels may also be not square, i.e., the array may include more superpixels in one dimension than in the other.

Each superpixel 102 may include six pixels 104A-F. Pixels 104A-C are polarization pixels, and pixels 104D-F are spectral pixels. The polarization pixels and spectral pixels are arranged adjacent to each other, such as in a 2-by-3 grid as shown in FIG. 1. While six pixels, including three polarization pixels and three spectral pixels, are shown, it is expressly contemplated that a different number of polarization pixels and/or a different number of spectral pixels form a superpixel. The imaging sensor 100 simultaneously captures and co-registers twelve multispectral and three polarization images as described in detail below. Illustratively, the imaging sensor 100 may have a temporal resolution of thirty or more frames per second. An analog-to-digital converter (ADC) 106 allows for digitization of the sensor data and transmission to a computer that is coupled to the imaging sensor.

Figure 2:
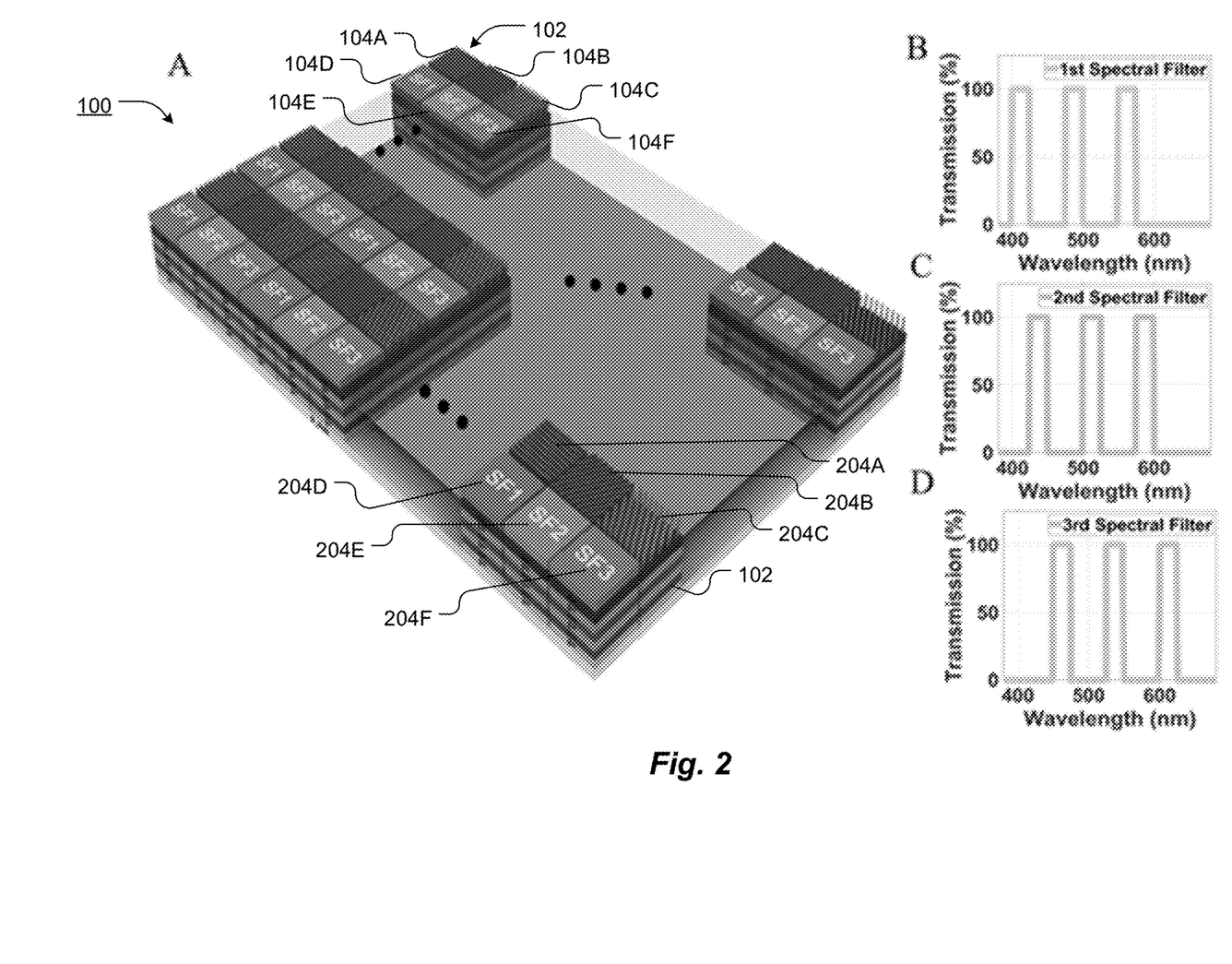
FIG. 2 shows a spectral polarization imaging sensor in accordance with an embodiment of the present invention.

FIG. 2 shows a spectral polarization imaging sensor in accordance with an embodiment of the present invention. Imaging sensor 100, as described above, includes an array of superpixels 102. Each superpixel 102 illustratively includes three polarization pixels 104A-C and three spectral pixels 104D-F. Each pixel 104A-C is a monolithically integrated polarization filter on top of an array of vertically stacked photodiodes. Each pixel 104D-F is a monolithically integrated spectral filter on top of an array of vertically stacked photodiodes.

Each superpixel 102 therefore includes six distinct pixels. The three polarization pixels 104A-C filter incident light with 0°, 60°, and 120° linear polarization filters. By way of example, pixel 104A includes a 0° linear polarization filter 204A, pixel 104B includes a 60° linear polarization filter 204B, and pixel 104C includes a 120° linear polarization filter 204C. Each of the three polarization filters 204A-C is arranged on top of an array of vertically stacked photodiodes, as shown in more detail below in FIG. 3.

Each of the three spectral pixels 104D-F includes a narrowband spectral filter. The spectral filter 204D of pixel 104D filters different parts of the spectrum than the spectral filter 204E of pixel 104E and the spectral filter 204F of pixel 104F. The spectral filter 204E of pixel 104E filters a different part of the spectrum than the spectral filters 204D of pixel 104D and the spectral filter 204F of pixel 104F. Each of the three spectral filters 204D-F is arranged on top of an array of vertically stacked photodiodes, as shown in more detail below in FIG. 3. Illustratively, the three spectral pixels and their respective narrowband spectral filters together may capture a total of nine narrowband spectral features from the imaged scene.

Sections B, C, and D of FIG. 2 show exemplary spectral transmissions of three spectral filters. The spectral filter 204D characterized in section B and part of spectral pixel 104D, for example, transmits photons with wavelengths in the range of 400-425 nm, 475-500 nm, and 550-575 nm. The spectral filter 204E characterized in section C and part of spectral pixel 104E transmits photons in the range of 425-450 nm, 500-525 nm, and 575-600 nm. The spectral filter 204F characterized in section D and part of spectral pixel 104F transmits photons in the range of 450-475 nm, 525-550 nm, and 600-625 nm. Hence, the three spectral pixels and their respective spectral filters capture nine distinct spectral features between 400 nm and 625 nm. In addition, each of the three polarization pixels captures an additional broadband spectral features different from the broadband spectral features captured by the other two polarization pixels. In total, the image sensor 100 therefore captures twelve spectral bands across the visible spectrum. The spectral filters 204D-F may be optical comb filters.

Figure 3:
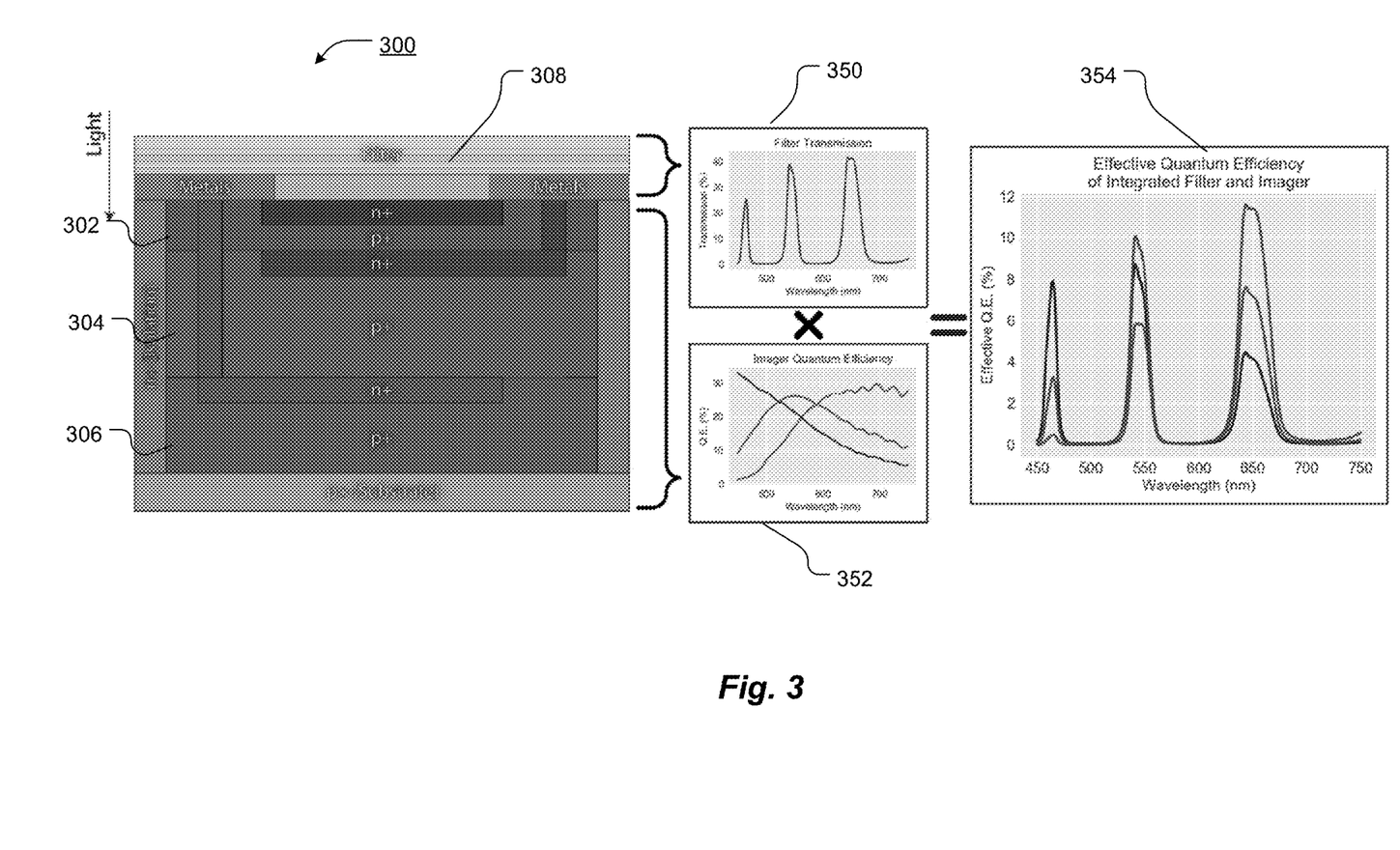
FIG. 3 shows a cross-sectional diagram of an exemplary pixel in accordance with an embodiment of the invention.

FIG. 3 shows a cross-sectional diagram of an exemplary pixel in accordance with an embodiment of the invention. Pixel 300 may be a spectral pixel or it may be a polarization pixel. Pixel 300 includes three photodiodes 302, 304, and 306. The photodiodes 302, 304, and 306 may, for example, be CMOS photodetectors. Pixel 300 also includes a filter 308. The filter and photodiodes are stacked such that light entering the pixel 300 is filtered by filter 308, then reaches the first photodiode 302 then the second photodiode 304, and finally the third photodiode 306. The photodiodes 302 and 304 are transparent so that light entering the pixel reaches all three photodiodes.

The absorption length of silicon strongly varies with wavelength, with 99% of blue photons (~400 nm) absorbed within 0.5 μm of penetration and 99% of red photons (~650 nm) absorbed within 16 μm of penetration. Recognizing the high density of photocharge generation by blue photons in a thin sheet near the surface and by red photons in a thick slab below the surface, the location and extent of photodiodes in the silicon can be selected to measure the amounts of blue light and red light in a scene—the blue-sensitive photodiode 302 may be shallow and of limited extent, while the red-sensitive photodiode 306 may be deeper and of greater extent. Green photons experience an intermediate absorption coefficient and can be detected with the intermediate photodiode 304. The vertically stacked photodiodes are fabricated by epitaxial growth of three positively doped silicon layers with individual thicknesses of 0.8, 2.8, and 4.3 followed by ion implantation to generate negatively doped regions.

If the pixel 300 is a spectral pixel, the filter 308 is a narrowband spectral filter, such as one of the spectral filters 204D-F shown in FIG. 2. As described above, the narrowband spectral filter may transmit photons with wavelengths in three different narrow spectral bands. These spectral bands may be optimized for accurate differentiation of manmade underwater objects such as mines. The spectral filter 308 then passes the photons that it transmits to the three underlying vertically stacked photodiodes 302, 304, and 306. Thus, given an exemplary superpixel having three pixels with different spectral filters, spectral reconstruction with a total of nine spectral features is achieved. The three narrowband-spectral filters may be designed with three narrow transmission bands at short, medium, and long wavelengths, and the stacked photosensitive structure is designed with three photodiodes that provide maximum quantum efficiencies for blue, green, and red light.

For a spectral pixel, diagram 350 shows the transmission of the narrowband spectral filter that transmits photons in three different spectral bands. Diagram 352 shows the quantum efficiencies of the three different photodiodes. The quantum efficiency of the first photodiode 302 is shown in blue, the quantum efficiency of the second photodiode 304 is shown in green, and the quantum efficiency of the third photodiode 306 is shown in red. It can be seen that the three photodiodes have different quantum efficiencies at different wavelengths. In addition, the quantum efficiency graph of one photodiode is different from the quantum efficiency graphs of the two other photodiodes. For example, the quantum efficiencies of a photodiode could be selected to correspond to the wavelengths of light that reaches that photodiode, so that the efficiencies are highest at those wavelengths. As a result, each photodiode measures different ratios of the radiant flux within the transmission bands, and the three photodiodes can be used to reconstruct the radiant flux at each transmission band. Diagram 354 shows the effective quantum efficiency of the combination of the stacked photodiodes and the spectral filter.

Figure 4:
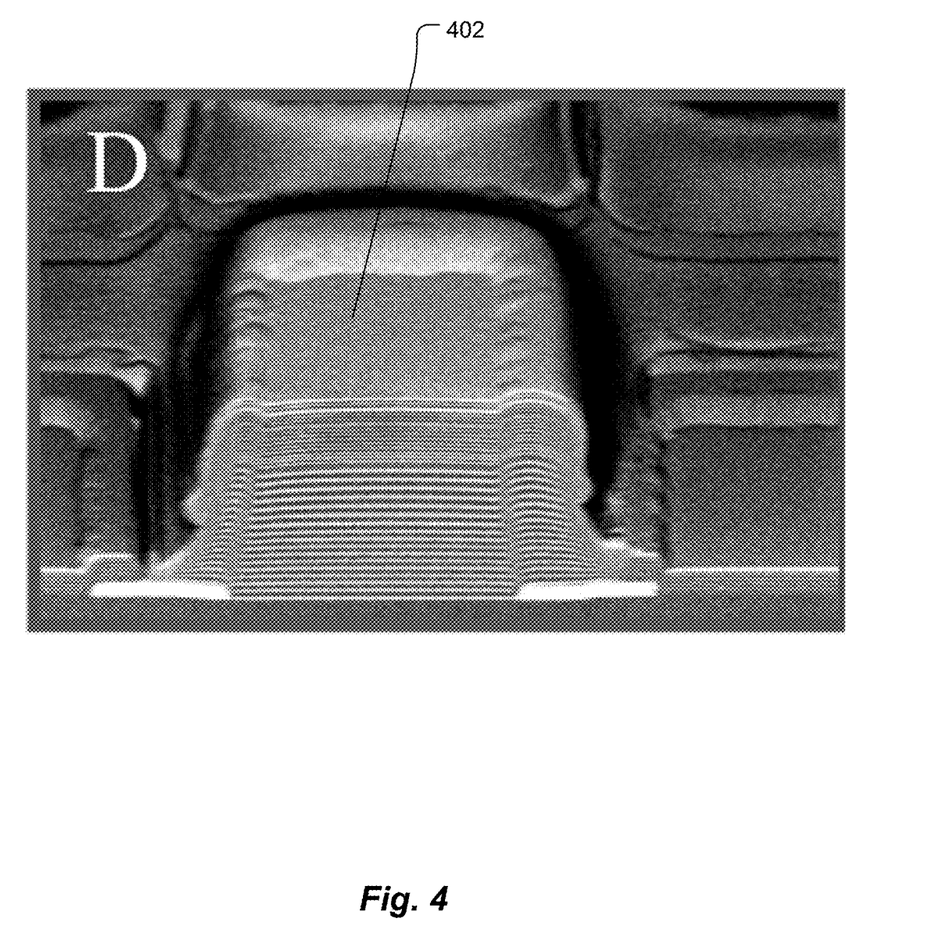
FIG. 4 is an electron scanning microscope image of a spectral filter in accordance with an embodiment of the present invention.

The array of pixelated spectral filters is fabricated by stacking submicron layers of silicon dioxide, silicon nitride, and hafnium oxide in different quantities and thicknesses on a glass substrate. FIG. 4 is an electron scanning microscope image of a spectral filter in accordance with an embodiment of the present invention. It can be seen that spectral filter 402 includes a stack of submicron layers. The filters provide in-band transmission of >60% and out-of-band rejection with optical density of ~2 OD. The monolithically integrated image sensor is produced by flip-chip bonding the arrays of vertically stacked silicon photodetectors and pixelated spectral filters. The image sensor exhibits an average read noise of ~70 e⁻ and an average dark current of ~182 e⁻/sec. With regard to dark current, most remote-sensing applications require real-time rates of ~25 frames per second (<40 msec/frame), limiting the quantity of dark charge that can be accumulated and the power of dark noise that can be observed. A fixed-pattern noise of 1.4% is maintained due to difference double sampling in the imager circuitry and high uniformity between the spectral filters.

If the pixel 300 is a polarization pixel, the filter 308 is a linear polarization filter such as on the polarization filters 204A-C shown in FIG. 2. In this case and by way of example, the filter 308 may filter polarized light at 0°, 60°, or 120°. The polarization filter 308 is integrated with the vertically stacked photodiodes 302, 304, and 306. Since the vertically stacked photodiodes 302, 304, and 306 have broad spectral response across the visible spectrum, the first Stokes parameter, $S_0$ provides three additional spectral features from the imaged environment. Hence, a total of 12 spectral features are used for image analysis and classification of objects.

The pixelated spectral and polarization filters are designed and optimized for high transmission of the desired spectral band, as well as high rejection of the unwanted spectral and polarization bands, by stacking layers of metals (silver, platinum, or aluminum) and dielectrics (silicon dioxide or silicon nitride). Once the filter's optical properties are optimized, the filters is fabricated by semiconductor fabs.

The polarization filters may be fabricated on an 8-inch silica wafer using deep-UV lithography and reactive ion etching. With the advancement of semiconductor fabrication techniques down to 10 nm resolution, fabricating aluminum nanowires as optical filters is becoming feasible and commercially available. The polarization filters can therefore be fabricated in commercial semiconductor fabs by depositing aluminum, patterning a photo resist with deep UV lithography, and using reactive ion etching to pattern the aluminum.

The spectral filters are then fabricated on the wafer with the pixelated polarization filters. An optimized fabrication procedure for realizing pixelated spectral filters is commercially available, for example by Salvo Technologies (Largo, Fla).

Once the pixelated spectral and polarization filters are fabricated, they are then monolithically integrated with the image sensor. The inventors have developed a fabrication process for monolithically integrating pixelated spectral and polarization filters with various image sensors using a custom alignment stage with nanometric precision and specialized optics. During the alignment process, live images are streamed to a computer from the image sensor where the filters will be deposited. These images are analyzed via custom-developed software, which will help the operator align the pixelated filters with the image sensor. Once the filters are aligned, a UV-activated adhesive with index of refraction matching the top surface of the image sensor is used to bond the filters to the imager surface. Hence, the pixelated filters are within ~100 nm from the imager surface, minimizing any optical crosstalk between neighboring pixels.

The imaging sensor also incorporates two new circuitries that help reduce noise performance over previous designs: Correlated Double Sampling (CDS) circuitry for readout noise cancelation, and a new pixel design including four transistors with pinned photodiodes. The new pixel design includes a charge transfer transistor, which is necessary to reduce the reset noise in the CDS circuitry down to ~1 e⁻. Today's state-of-the-art imagers utilize four transistors per pixel with pinned photodiodes to achieve sub-electron readout noise by utilizing CDS techniques. However, the complex layout in implementing pinned photodiodes, floating diffusion nodes, and individual transfer transistors for each of the three vertically stacked photodiodes would result in a pixel with large pitch and small fill factor. Therefore, transistor sharing between neighboring pixels is utilized to reduce the pixel pitch to 10 µm or less. The sensor is be fabricated in a semiconductor fab that provides a 180 nm CMOS process with optimized vertically stacked photodiodes.

The imaging sensor may be housed in a low noise printed circuit board that ensures real-time image acquisition and transmission of the image data to a computer for data analysis and display. The custom printed circuit board interfaces with a data acquisition board from OpalKelly (Portland, OR), which provides USB 3.0 transfer rates of ~480 MB/second. This transfer bandwidth is required to ensure real-time acquisition of the data collected by the superpixels across the 4-megapixel imaging array.

As used herein, numerical terms, such as "first," "second," and "third," are used to distinguish respective photodiode layers from one another and are not intended to indicate any particular order or total number of photodiode layers in any particular embodiment. Thus, for example, a given embodiment may include only a second photodiode layer and a third photodiode layer.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A superpixel for a digital camera, the superpixel comprising:
   an array of spectral pixels and an adjacent array of polarization pixels, wherein:
   each spectral pixel comprises:
     a first stack of at least two photodiodes, each photodiode of the at least two photodiodes configured to have a quantum efficiency at a wavelength different from the quantum efficiency at the wavelength of each other photodiode of the at least two photodiodes; and
     a spectral filter configured to pass at least two transmission peaks to its respective first stack of at least two photodiodes; and
   each polarization pixel comprises:

a second stack of at least two photodiodes, each photodiode of the at least two photodiodes configured to have a quantum efficiency at a wavelength different from the quantum efficiency at the wavelength of each other photodiode of the at least two photodiodes; and a polarization filter configured to pass a polarization of light to its respective second stack of at least two photodiodes different from the polarization passed by each other polarization filter in the superpixel.

2. A superpixel according to claim 1, wherein the superpixel comprises three spectral pixels.

3. A superpixel according to claim 2, wherein:
the spectral filter of a first one of the three spectral pixels is an optical comb filter configured to pass transmission peaks in the ranges of 400-425 nm, 475-500 nm, and 550-575 nm;
the spectral filter of a second one of the three spectral pixels is an optical comb filter configured to pass transmission peaks in the ranges of 425-450 nm, 500-525 nm, and 575-600 nm; and
the spectral filter of a third one of the three spectral pixels is an optical comb filter configured to pass transmission peaks in the ranges of 450-475 nm, 525-550 nm, and 600-625 nm.

4. A superpixel according to claim 1, wherein the superpixel comprises three polarization pixels.

5. A superpixel according to claim 4, wherein:
the polarization filter of a first one of the three polarization pixels is configured to pass a 0 degree polarization of light;
the polarization filter of a second one of the three polarization pixels is configured to pass a 60 degree polarization of light; and
the polarization filter of a third one of the three polarization pixels is configured to pass a 120 degree polarization of light.

6. A superpixel according to claim 1, wherein each spectral pixel comprises a first stack of three photodiodes.

7. A superpixel according to claim 1, wherein each polarization pixel comprises a second stack of three photodiodes.

8. A superpixel according to claim 1, wherein each photodiode in a first stack of photodiodes has a different quantum efficiency.

9. A superpixel according to claim 1, wherein each photodiode in a second stack of photodiodes has a different quantum efficiency.

10. A superpixel according to claim 1, wherein each photodiode is a CMOS photodetector.

11. A pixelated image sensor comprising:
an at least 2048 by 2048 array of superpixels, wherein each superpixel comprises:
an array of spectral pixels and an adjacent array of polarization pixels, wherein:
each spectral pixel comprises:
a first stack of at least two photodiodes, each photodiode of the at least two photodiodes configured to have a quantum efficiency at a wavelength different from the quantum efficiency at the wavelength of each other photodiode of the at least two photodiodes; and a spectral filter configured to pass at least two transmission peaks to its respective first stack of at least two photodiodes; and
each polarization pixel comprises:
a second stack of at least two photodiodes, each photodiode of the at least two photodiodes configured to have a quantum efficiency at a wavelength different from the quantum efficiency at the wavelength of each other photodiode of the at least two photodiodes; and
a polarization filter configured to pass a polarization of light to its respective second stack of at least two photodiodes different from the polarization passed by each other polarization filter in the superpixel.

12. A pixelated image sensor according to claim 11, wherein each superpixel comprises three spectral pixels.

13. A pixelated image sensor according to claim 11, wherein for each superpixel:
the spectral filter of a first one of the three spectral pixels is an optical comb filter configured to transmit photons having wavelengths in the ranges of 400-425 nm, 475-500 nm, and 550-575 nm;
the spectral filter of a second one of the three spectral pixels is an optical comb filter configured to transmit photons having wavelengths in the ranges of 425-450 nm, 500-525 nm, and 575-600 nm; and
the spectral filter of a third one of the three spectral pixels is an optical comb filter configured to transmit photons having wavelengths in the ranges of 450-475 nm, 525-550 nm, and 600-625 nm.

14. A pixelated image sensor according to claim 11, wherein each superpixel comprises three polarization pixels.

15. A pixelated image sensor according to claim 14, wherein for each superpixel:
the polarization filter of a first one of the three polarization pixels is configured to pass a 0 degree polarization of light;
the polarization filter of a second one of the three polarization pixels is configured to pass a 60 degree polarization of light; and
the polarization filter of a third one of the three polarization pixels is configured to pass a 120 degree polarization of light.

16. A pixelated image sensor according to claim 11, wherein, in each superpixel, each spectral pixel comprises a first stack of three photodiodes.

17. A pixelated image sensor according to claim 11, wherein, in each superpixel, each polarization pixel comprises a second stack of three photodiodes.

18. A pixelated image sensor according to claim 11, wherein, in each superpixel, each photodiode in a first stack of photodiodes has a different quantum efficiency.

19. A pixelated image sensor according to claim 11, wherein, in each superpixel, each photodiode in a second stack of photodiodes has a different quantum efficiency.

20. A pixelated image sensor according to claim 11, wherein the array of superpixels has a superpixel pitch no greater than 10 μm.

* * * * *